United States Patent
Krishnan

(10) Patent No.: US 9,633,878 B1
(45) Date of Patent: Apr. 25, 2017

(54) CONVEYOR APPARATUS AND METHOD FOR TRANSPORTING LEADFRAME

(71) Applicant: TEXAS INSTRUMENTS INCORPORATED, Dallas, TX (US)

(72) Inventor: Nageswararau Krishnan, Kuala Lumpur (MY)

(73) Assignee: TEXAS INSTUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/135,310

(22) Filed: Apr. 21, 2016

(51) Int. Cl.
  B65G 21/20 (2006.01)
  B65G 35/00 (2006.01)
  H01L 21/677 (2006.01)
  H01L 21/687 (2006.01)
  B65G 54/02 (2006.01)

(52) U.S. Cl.
  CPC ........ H01L 21/67721 (2013.01); B65G 54/02 (2013.01); H01L 21/68785 (2013.01)

(58) Field of Classification Search
  CPC B65G 21/20; B65G 21/2009; B65G 21/2045; B65G 21/2054; B65G 54/02; B65G 17/46
  USPC .. 198/805, 468.5, 619, 690.1, 803.6, 867.04
  See application file for complete search history.

(56) References Cited

U.S. PATENT DOCUMENTS

| | | | |
|---|---|---|---|
| 4,590,667 A | 5/1986 | Simon | |
| 4,853,968 A | 8/1989 | Berkin | |
| 5,152,446 A * | 10/1992 | Dani | B23K 9/0253 100/295 |
| 5,307,978 A | 5/1994 | Ricketson et al. | |
| 6,045,319 A | 4/2000 | Uchida et al. | |
| 6,591,756 B2 * | 7/2003 | Mayer | B23Q 5/28 198/619 |
| 6,594,889 B1 | 7/2003 | Bandoh et al. | |
| 7,293,950 B2 * | 11/2007 | Bonora | H01L 21/67766 198/619 |
| 7,905,195 B2 * | 3/2011 | Yamasaki | H01L 21/67784 198/817 |
| 2002/0196043 A1 * | 12/2002 | Tsui | G01R 31/2886 324/756.02 |
| 2006/0011093 A1 * | 1/2006 | Jensen | B60L 13/04 198/619 |
| 2006/0081448 A1 * | 4/2006 | Fandella | B65G 17/086 198/805 |
| 2007/0284225 A1 * | 12/2007 | Volpi | B29C 45/0013 198/805 |

* cited by examiner

*Primary Examiner* — James R Bidwell
(74) *Attorney, Agent, or Firm* — Rose Alyssa Keagy; Charles A. Brill; Frank D. Cimino

(57) ABSTRACT

A conveyor apparatus for a leadframe includes a track defining a longitudinally extending passage through which the leadframe travels. A magnetic clamping system and a plurality of first guide magnets are provided on the track. A gripping device is provided for securing to the leadframe. At least one clamping magnet and a plurality of second guide magnets are secured to the gripping device. The first and second guide magnets cooperate to move the gripping device in a first direction along the length of the passage. The magnetic clamping system and the at least one clamping magnet cooperate to selectively move the gripping device in a second direction perpendicular to the first direction between a first condition spaced from the track to a second condition magnetically fixed to the track.

20 Claims, 10 Drawing Sheets

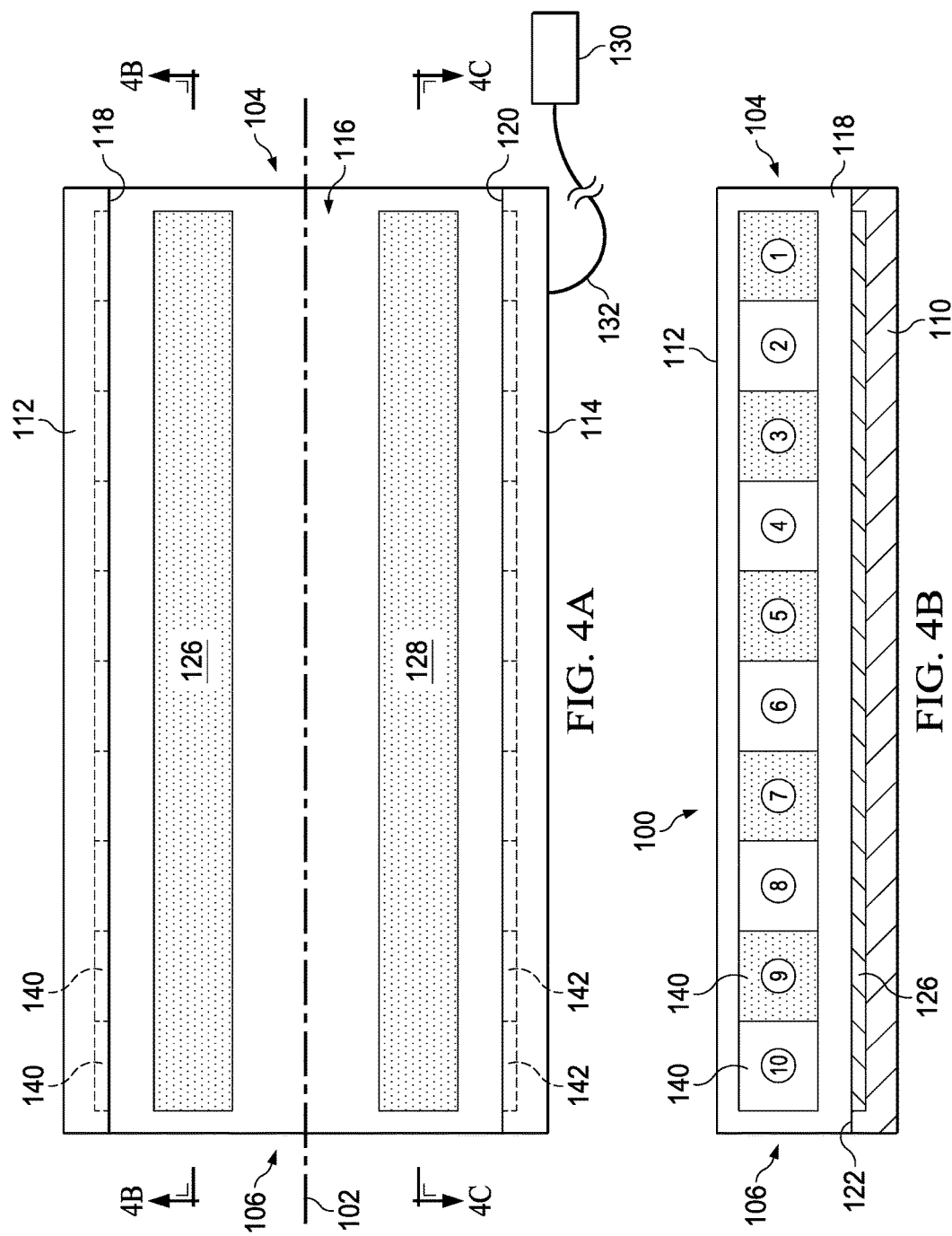

CONVEYOR APPARATUS AND METHOD FOR TRANSPORTING LEADFRAME

TECHNICAL FIELD

The disclosure relates to leadframe processing and, in particular, relates to a magnetic conveyor apparatus for transporting a leadframe.

BACKGROUND

Electrical components, e.g., dies, wires, etc., are secured to a leadframe as the leadframe moves linearly along a transport system. The transport system includes gripping mechanisms at each end thereof that sequentially hold the leadframe in place while the components are secured thereto. The leadframe, however, is prone to damage when it reaches certain indexing positions along the conveyor due to cantilevering of the conveyor.

SUMMARY

In one example, a conveyor apparatus for a leadframe includes a track defining a longitudinally extending passage through which the leadframe travels. A magnetic clamping system and a plurality of first guide magnets are provided on the track. A gripping device is provided for securing to the leadframe. At least one clamping magnet and a plurality of second guide magnets are secured to the gripping device. The first and second guide magnets cooperate to move the gripping device in a first direction along the length of the passage. The magnetic clamping system and the at least one clamping magnet cooperate to selectively move the gripping device in a second direction perpendicular to the first direction between a first condition spaced from the track to a second condition magnetically fixed to the track.

In another example, a method for conveying a leadframe includes providing a track defining a passage through which the leadframe travels. A magnetic clamping system and a plurality of first guide magnets are provided on the track. A gripping device is secured to the leadframe and includes at least one clamping magnet and a plurality of second guide magnets to the leadframe. The gripping device and the leadframe are magnetically moved in a first direction through the passage using the first and second guide magnets. A first magnetic interaction is induced between the magnetic clamping system and the at least one clamping magnet to space the gripping device from the track and allow the gripping device to move the leadframe in the first direction. A second, different magnetic interaction is induced between the magnetic clamping system and the at least one clamping magnet to move the gripping device in a second direction perpendicular to the first direction to magnetically fix the gripping device to the track.

In another example, a conveyor apparatus includes a leadframe having a longitudinal centerline and first and second sides extending parallel to the centerline. Each first and second side has a ferromagnetic coating. A track defines a longitudinal passage through which the leadframe travels in a first direction. A plurality of electromagnets is secured to the track adjacent the coating on each side of the leadframe. The electromagnets have a first condition spaced from the coatings on the leadframe and magnetically cooperating with the coatings to levitate the leadframe above the track. The electromagnets have a second condition magnetically cooperating with the coatings such that the coatings engage the electromagnets to fix the leadframe to the track. A gripping device associated with the track grasps the leadframe when the electromagnets are in the first condition to move the leadframe in the first direction.

BRIEF DESCRIPTION OF THE DRAWINGS

FIG. 4A is a top view of a track of the apparatus of FIG. 1.

FIG. 4B is a section view taken along line 4B-4B of FIG. 4A.

DETAILED DESCRIPTION

Figure 1:
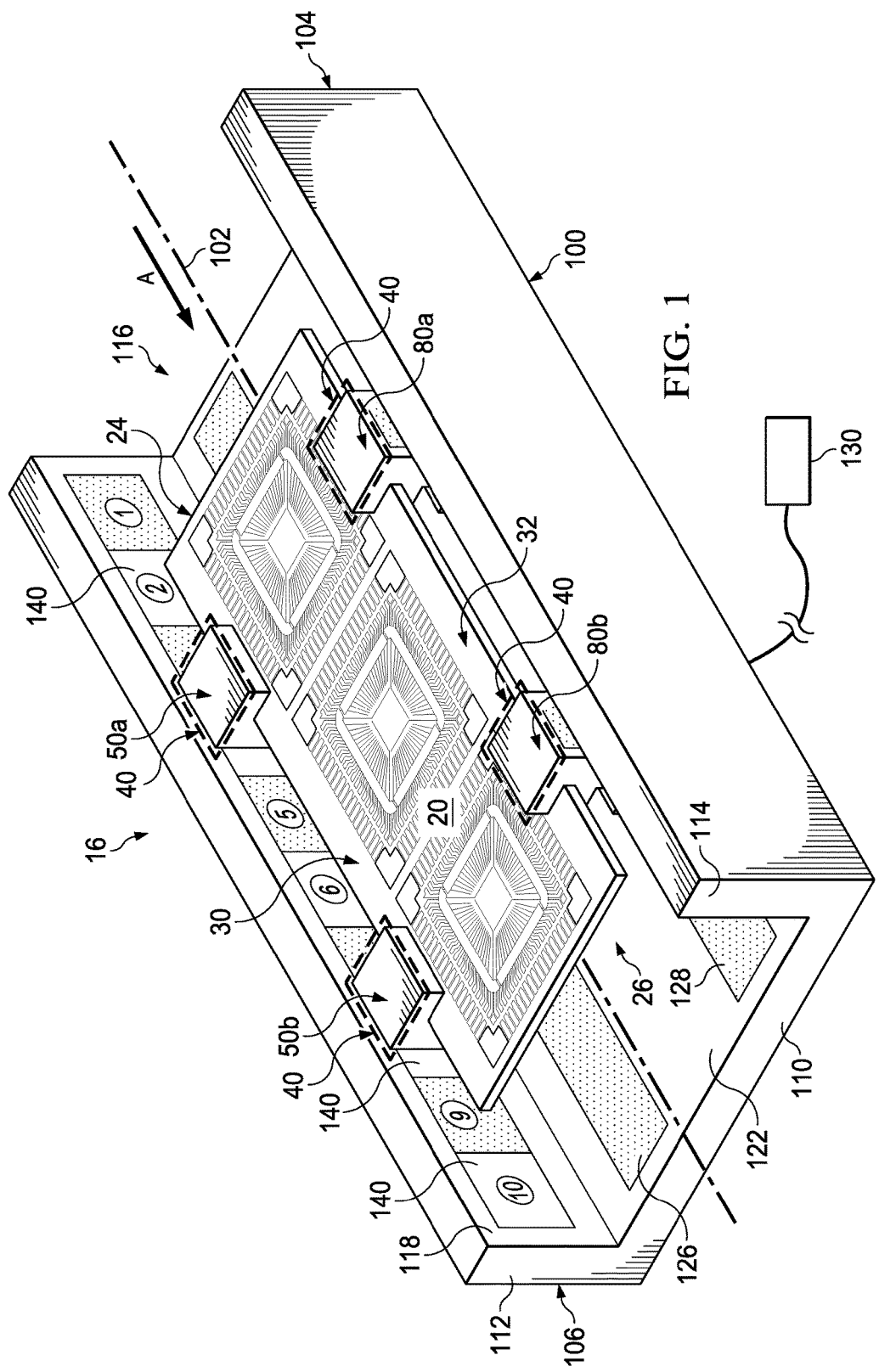
FIG. 1 is an isometric view of an example conveyor apparatus for transporting a leadframe.
Figure 2:
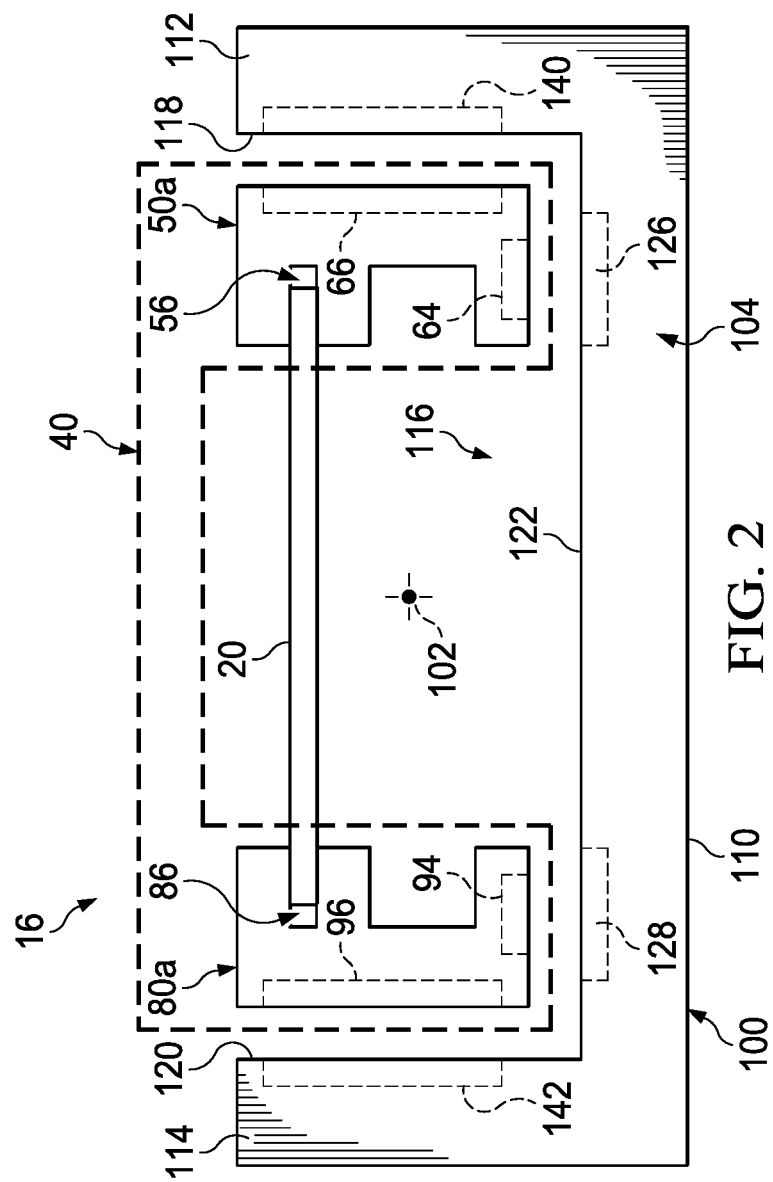
FIG. 2 is a front view of the apparatus of FIG. 1.

This disclosure relates to leadframe processing and, more particularly, relates to a magnetic conveyor apparatus and method for transporting a leadframe. FIGS. 1-2 illustrate an example conveyor apparatus 16 for magnetically transporting a substrate or leadframe 20. In one example, the conveyor 16 transports a leadframe 20 from a supply magazine to a receiving magazine (not shown). The conveyor 16 can also fix the leadframe 20 in place to allow one or more bonding operations to be performed. As shown, the leadframe 20 constitutes a metal structure forming part of a circuit board or chip package. For example, the leadframe 20 is formed from a plurality of individual leadframe units integrally formed together in an end-to-end manner.

Referring to the example of FIG. 1, the conveyor 16 includes a gripping device 40 secured to the leadframe 20. A track 100 magnetically interacts with the gripping device 40 to control movement of the leadframe 20 through the track. The leadframe 20 is planar and extends longitudinally from a first end 24 to a second end 26. As shown, the leadframe 20 is rectangular, but could have another shape, which may be linear or non-linear along its length. The leadframe 20 has a first lateral side 30 and an opposing, second lateral side 32.

Figure 3A:
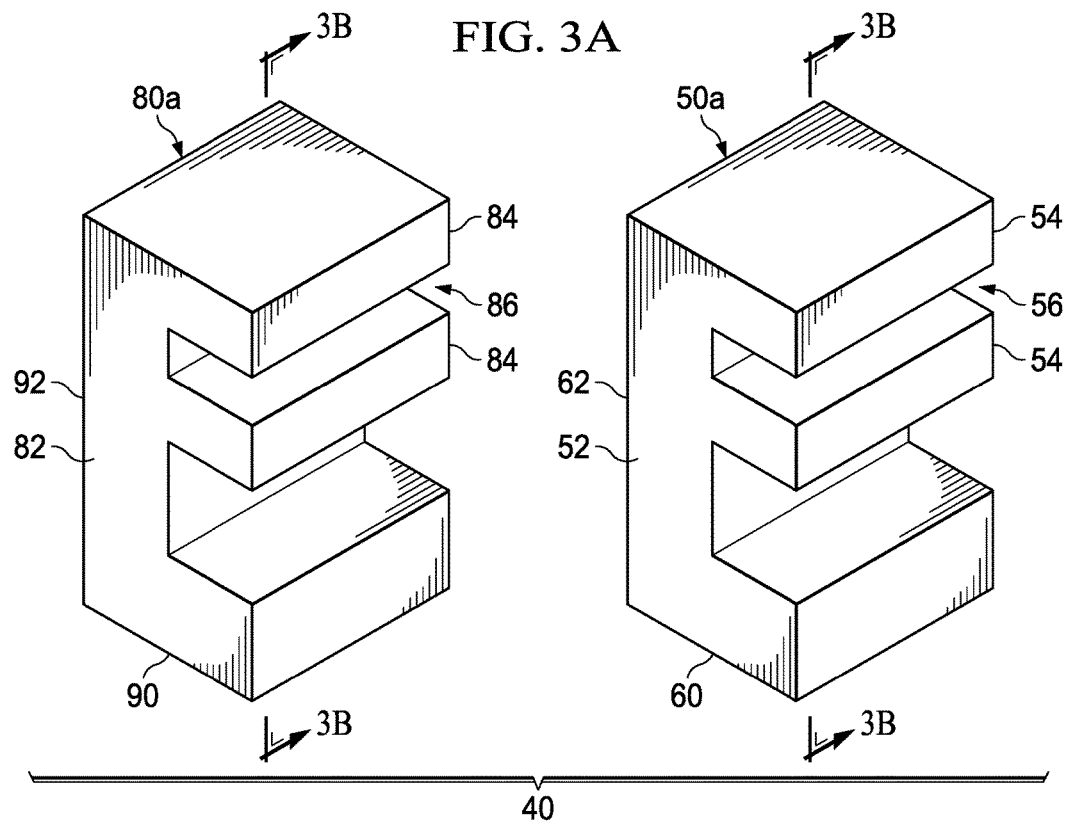
FIG. 3A is an isometric view of gripping devices of the apparatus of FIG. 1.
Figure 3B:
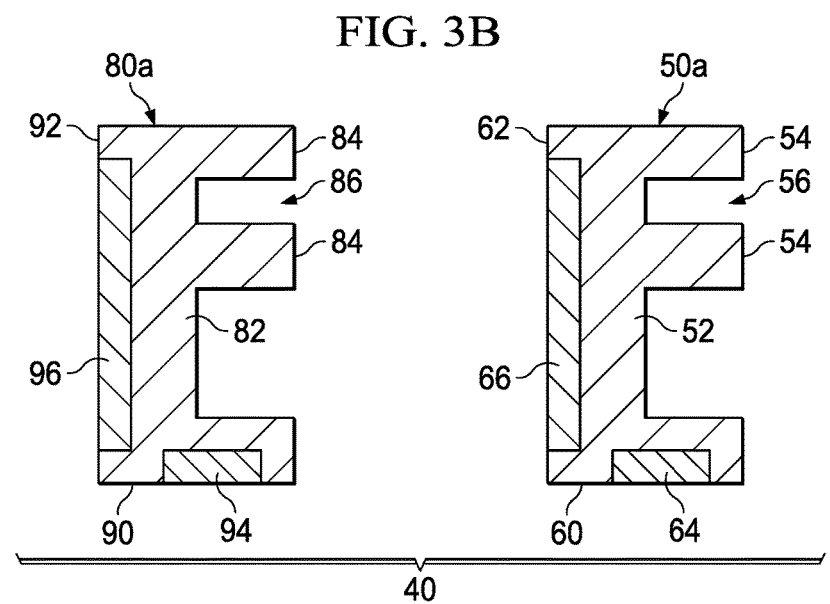
FIG. 3B shows section views taken along lines 3B-3B of FIG. 3A.

The gripping device 40 includes a pair of first gripping members 50a, 50b and a pair of second gripping members 80a, 80b that grip the leadframe 20 The gripping device 40 can have more or fewer first gripping members 50a, 50b and/or second gripping members 80a, 80b. Referring to FIGS. 3A-3b, each first gripping member 50a includes a rigid base 52 having a pair of arms 54. The base 52 can be L-shaped and formed from a non-magnetic material. The base 52 has a first side 60 and a second side 62. In one example, the first side 60 is the bottom of the base 52 and the second side 62 is the lateral, outer side of the base. The arms 54 extend parallel to one another and are spaced apart to provide a gap 56 configured to receive a portion of the first side 30 of the leadframe 20.

A clamping magnet 64 is provided on the first side 60 and constitutes a permanent magnet. A guide magnet 66 is provided on the second side 62 and similarly constitutes a permanent magnet. The clamping magnet 64 and guide magnet 66 are oriented perpendicular to one another but could have an alternative orientation (not shown). The clamping magnet 64 and guide magnet 66 can have the same polarity or opposing polarities. In one example, the clamping magnet 64 on the first gripping member 50*a* has a North (N) polarity and the guide magnet 66 has an opposing South (S) polarity.

The clamping magnet 64 can be exposed through the first side 60 of the base 52 or completely covered by the base (not shown). Similarly, the guide magnet 66 can be exposed through the second side 62 of the base 52 or completely covered by the base (not shown). In any case, the magnetic fields of the magnets 64, 66 extend outward from the first gripping member 50*a* beyond the respective side 60 and 62.

Although not shown in FIGS. 3A-3B, it will be appreciated that the first gripping member 50*b* has the same construction as the first gripping member 50*a*. The only difference is that the guide magnet 66 in the first gripping member 50*b* has the opposite polarity as the guide magnet 66 in the first gripping member 50*a*. Thus, in this example, the clamping magnet 64 on the first gripping member 50*b* has an N polarity and the guide magnet 66 has an N polarity.

Each second gripping member 80*a* includes a rigid base 82 having a pair of arms 84. The base 82 can be L-shaped and is formed from a non-magnetic material. The base 82 has a first side 90 and a second side 92. In one example, the first side 90 is the bottom of the base 82 and the second side 92 is the lateral, outer side of the base. The arms 84 extend parallel to one another and are spaced apart to provide a gap 86 configured to receive a portion of the second side 32 of the leadframe 20.

A clamping magnet 94 is provided on the first side 90 and constitutes a permanent magnet. A guide magnet 96 is provided on the second side 92 and constitutes a permanent magnet. The clamping magnet 94 and guide magnet 96 are oriented perpendicular to one another but could have an alternative orientation (not shown). The clamping magnet 94 and guide magnet 96 can have the same polarity or opposing polarities. In one example, the clamping magnet 94 on the second gripping member 80*a* has an N polarity and the guide magnet 96 has an N polarity.

The clamping magnet 94 can be exposed through the first side 90 of the base 82 or completely covered by the base (not shown). Similarly, the guide magnet 96 can be exposed through the second side 92 of the base 82 or completely covered by the base (not shown). In any case, the magnetic fields of the magnets 94, 96 extend outward from the second gripping member 80*a* beyond the respective side 90 and 92.

Although not shown in FIGS. 3A-3B, it will be appreciated that the second gripping member 80*b* has the same construction as the second gripping member 80*a*. The only difference is that the guide magnet 96 in the second gripping member 80*b* has the opposite polarity as the guide magnet 96 in the second gripping member 80*a*. Consequently, the clamping magnet 94 on the second gripping member 80*b* has an N polarity and the guide magnet 96 has a S polarity.

The gripping members 50*a*, 50*b*, 80*a*, 80*b* are shown as being four separate components of the gripping device 40. It will be appreciated, however, that the gripping members 50*a*, 50*b*, 80*a*, 80*b* could be secured together to form a unitary gripping device 40 in which the gripping members cannot move relative to one another. In one example, the bases 52, 82 of the gripping members 50*a*, 50*b*, 80*a*, 80*b* are connected together (not shown).

Referring to FIGS. 1 and 4A, the track 100 has a longitudinal centerline 102 and extends from a first end 104 to a second end 106. The track 100 includes a base 110 and a pair of arms 112, 114 extending upwardly from the base 110 on opposite sides of the centerline 102. The base 110 and arms 112, 114 cooperate to form a generally U-shaped track 100 defining a longitudinal passage 116. The arms 112, 114 include interior sides 118 and 120, respectively, facing the centerline 102 and one another. The base 110 includes an interior side 122 facing the centerline 102.

As shown in the example of FIG. 4A-4B, a magnetic clamping system including a pair of clamping magnets 126, 128 is provided on the interior side 122 of the base 110 on opposite sides of the centerline 102. Each clamping magnet 126, 128 extends substantially the length of the track 100. Alternatively, the clamping magnets 126, 128 can be located only at the midpoint of the length of the track 100 (not shown). As an example, each clamping magnet 126, 128 constitutes an electromagnet or solenoid that changes polarity in response to an electric current. The current can be provided by an electrical source indicated generally at 130 and electrically connected to the track 100 by wires 132. Due to this construction, the strength and polarity of the clamping magnets 126, 128 is adjustable, depending on the current applied thereto.

When the gripping device 40 is a unitary structure, a single clamping magnet can be provided in the base 110, e.g., in a position equidistant from the arms 112, 114. This single clamping magnet would cooperate with a single clamping magnet on the gripping device 40 positioned between the sets of gripping members 50*a*, 50*b* and 80*a*, 80*b*.

FIG. 4B illustrates a series of guide magnets 140 provided on the interior side 118 of the first arm 112 facing the centerline 102. The guide magnets 140 are electromagnets or solenoids that generate magnetic fields in response to an electric current provided by the source 130. Consequently, the strength of the guide magnets 140 is adjustable, depending on the current applied thereto. The guide magnets 140 alternate in polarity along the length of the first arm 112 between the first and second ends 104, 106. As shown, each guide magnet 140 has a position index indicated at (1), (2), (3), etc. along the length of the track 100.

Figure 4C:
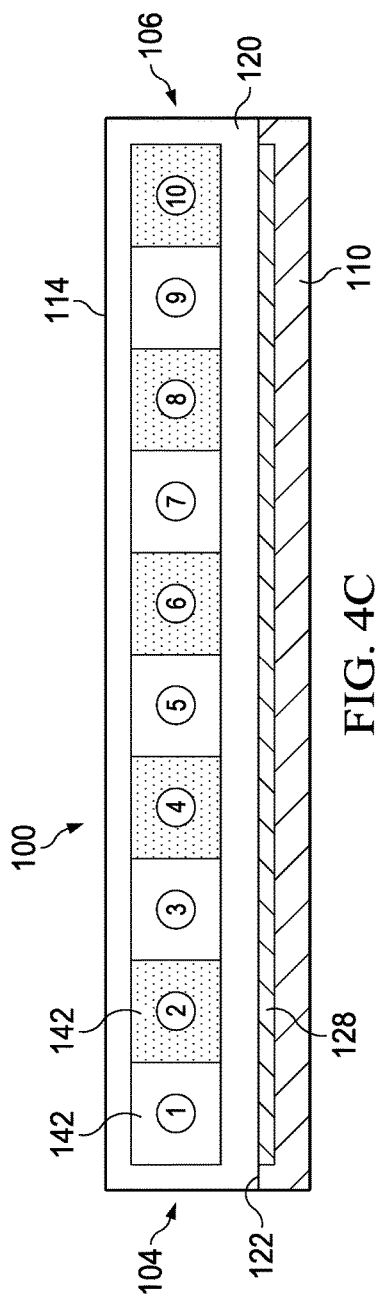
FIG. 4C is a section view taken along line 4C-4C of FIG. 4A.

FIG. 4C illustrates a series of guide magnets 142 provided on the interior side 120 of the second arm 114 facing the centerline 102. In the example of FIG. 4C, the guide magnets 142 are electromagnets or solenoids that generate magnetic fields in response to an electric current provided by the source 130. Consequently, the strength of the guide magnets 142 and polarity is adjustable, depending on the current applied thereto. The guide magnets 142 alternate in polarity along the length of the second arm 114 between the first and second ends 104, 106. As shown, each guide magnet 142 has a position index indicated at (1), (2), (3), etc. along the length of the track 100. The track 100 includes the same number of guide magnets 142 as guide magnets 140. The polarity of the guide magnet 140 at each position index (1)-(10) on the first arm 112 is opposite to the polarity of the corresponding guide magnet 142 at the corresponding position index (1)-(10) on the second arm 114.

The guide magnets 140, 142 can be exposed through the interior side 118, 120 of the respective arm 112, 114 or completely covered by the arm (not shown). Similarly, the clamping magnets 126, 128 can be exposed through the interior side 122 of the base 110 or completely covered by the base (not shown). In any case, the magnetic fields of the magnets 126, 128, 140, 142 extend inwards beyond the respective interior side 118, 120, 122 and into the interior passage 116.

FIGS. 1-2 and 5-6B illustrate the fully assembled conveyor 16. The gripping members 50a, 50b are positioned within the passage 116 of the track 100 and magnetically interact with the magnets 126, 128, 140, 142 provided on the track. Referring to FIG. 1, the leadframe 20 exits the supply magazine (not shown) and passes into the gaps 56, 86 in the gripping members 50a, 50b, 80a, 80b. As a result, the first gripping members 50a, 50b are positioned along the first side 30 of the leadframe 20 and the second gripping members 80a, 80b are positioned along the second side 32. The leadframe 20 is securely fixed to the gripping members 50a, 50b, 80a, 80b in this condition.

Figure 5:
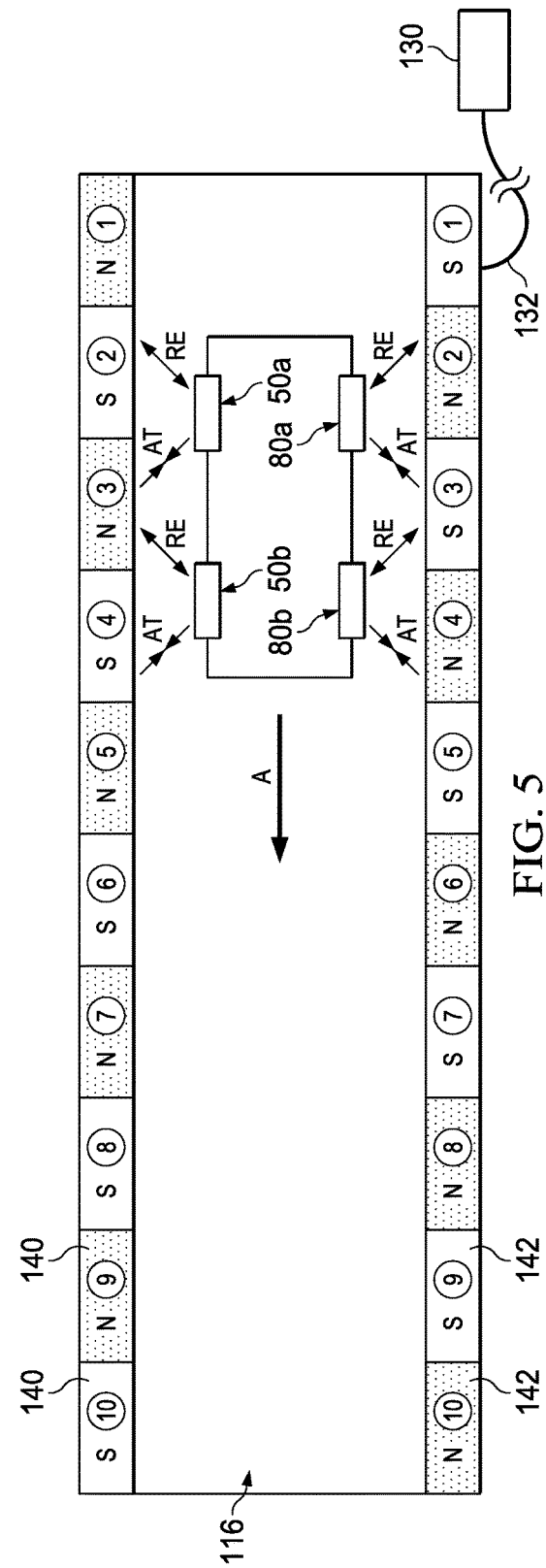
FIG. 5 is a schematic illustration of the apparatus of FIG. 1 magnetically transporting a leadframe along the track.
Figure 6A:
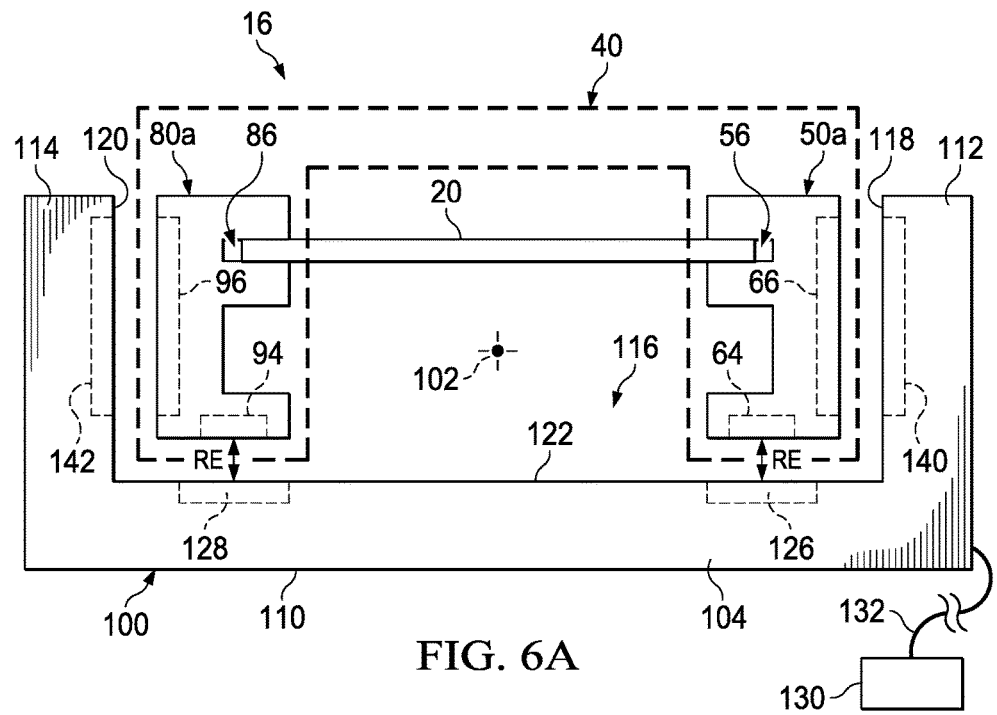
FIG. 6A is a front view of the apparatus during transport of the leadframe.

Referring to FIGS. 5 and 6A, the guide magnets 66 on the first gripping members 50a, 50b are aligned with and spaced from the guide magnets 140 on the first arm 112 of the track 100. As a result, the magnetic fields of the guide magnets 66, 140 overlap one another. The clamping magnets 64 on the first gripping members 50a, 50b are aligned with and spaced from the clamping magnet 126 on the base 110 of the track 100. As a result, the magnetic fields of the clamping magnets 64, 126 overlap and thus interact one another.

Figure 6B:
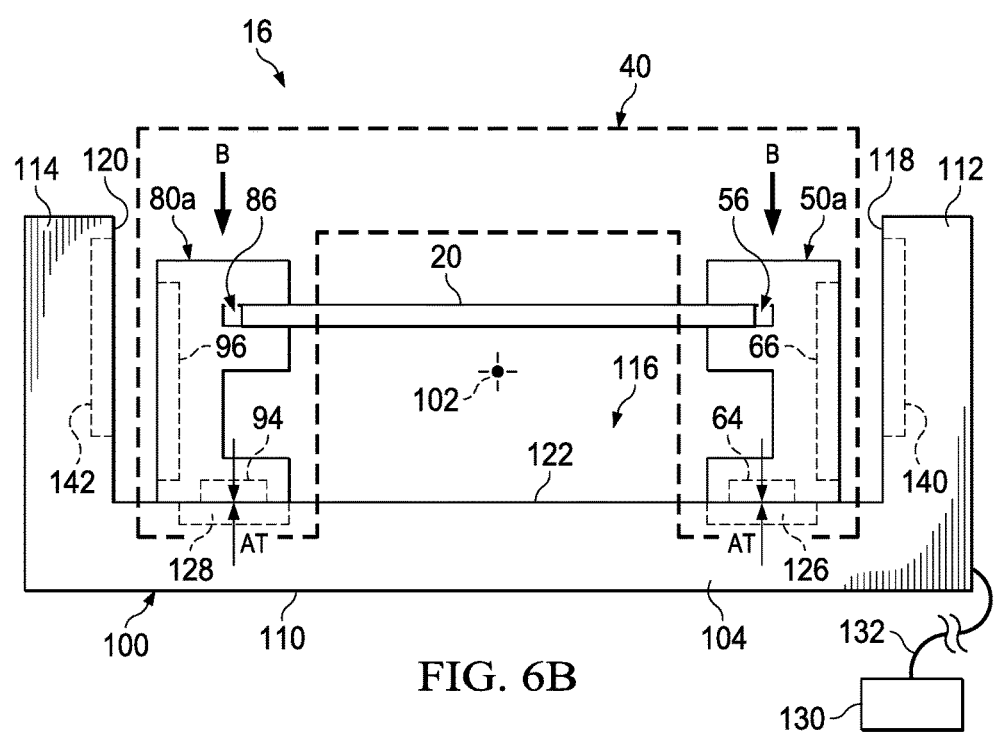
FIG. 6B is a front view of the apparatus when the leadframe is fixed to the track.

Referring to FIGS. 5 and 6B, the guide magnets 96 on the second gripping members 80a, 80b are aligned with and spaced from the guide magnets 142 on the second arm 114 of the track 100. As a result, the magnetic fields of the guide magnets 96, 142 overlap one another. The clamping magnets 94 on the second gripping members 80a, 80b are aligned with and spaced from the clamping magnet 128 on the base 110 of the track 100. As a result, the magnetic fields of the clamping magnets 94, 128 overlap and thus interact with one another.

The guide magnets 66, 140 and 96, 142, respectively, cooperate to move the gripping members 50a, 50b, 80a, 80b and leadframe 20 in a longitudinal direction A through the passage 116 in the track 100. As noted, the guide magnet 66 on the first gripping member 50a has an S polarity and the guide magnet 66 on the first gripping member 50b has an N polarity. The guide magnets 140 on the first arm 112 have alternating polarity N or S along the indexing positions (1)-(10). Therefore, applying current to the guide magnets 140 causes the guide magnets 66 to be magnetically repelled by the same polarity guide magnet 140 (indicated by the arrows RE) and magnetically attracted to the opposite polarity guide magnet 140 (indicated by the arrows AT). This magnetic attraction AT, and repelling RE occurs in an alternating manner in the direction A, such that the first gripping members 50a, 50b are urged to move in the direction A relative to the first arm 112.

As noted, the guide magnet 96 on the second gripping member 80a has an N polarity and the guide magnet 96 on the second gripping member 80b has a S polarity. The guide magnets 142 on the second arm 114 have alternating polarity S or N along the indexing positions (1)-(10). Therefore, applying current to the guide magnets 142 causes the guide magnets 96 to be magnetically repelled RE by the same polarity guide magnet 142 and magnetically attracted to the opposite polarity guide magnet 142. This magnetic attraction AT and repelling RE occurs in an alternating manner such that the second gripping members 80a, 80b are urged to move in the direction A relative to the second arm 114.

The gripping members 50a, 50b, 80a, 80b therefore cooperate to move the leadframe 20 in the direction A through the passage 116 of the track 100. The electric current supplied to the guide magnets 140, 142 by the source 130 can be specifically tailored and crafted to move the leadframe 20 in the direction A in any desired manner.

As noted, the clamping magnets 64 on the first gripping members 50a, 50b have an N polarity. The clamping magnet 126 on the base 110 can have an N or S polarity, depending on the current applied thereto by the source 130. Similarly, the clamping magnets 94 on the second gripping members 80a, 80b have an N polarity. The clamping magnet 128 on the base 110 can have an N or S polarity, depending on the current applied thereto by the source 130.

Due to this construction, the current applied to the clamping magnets 126, 128 can be controlled to selectively cause the gripping members 50a, 50b, 80b, 80b to abut the base 110 or be spaced therefrom depending on the current that is applied. In other words, the condition of the clamping magnets 126, 128 controls the height of the gripping members 50a, 50b, 80a, 80b relative to the base 110. To this end, as shown in the example of FIG. 6A, current can be applied to the clamping magnets 126, 128 in a manner that magnetically repels RE the gripping members 50a, 50b, 80a, 80b away the base 110 when it is desirable to allow the leadframe 20 to move in a contactless manner relative to the track 100 in the direction A. The clamping magnets 126, 128, when configured to repel the clamping magnets 64, 94, therefore cause the gripping members 501, 50b, 80a, 80b to levitate above the track 100.

As shown in the example of FIG. 6B, the current applied to the clamping magnets 126, 128 can also be selected to magnetically attract AT the gripping members 50a, 50b, 80a, 80b towards the base 110 when it is desirable to hold the leadframe 20 in a fixed position. More specifically, current can be applied to the clamping magnets 126, 128 in a manner that draws the clamping magnets 64, 94 downward in the direction indicated by the arrows B into engagement with the base 110. This direction B is perpendicular to the direction A the leadframe 20 travels through the track 100. The gripping members 50a, 50b, 80a, 80b are magnetically fixed to the base 110 in this configuration until the current applied by the source 130 is removed or reversed. While this occurs, the current supply to the guide magnets 140, 142 can be cut off such that the gripping members 50a, 50b, 80a, 80b do not interact with the track 100. Consequently, the leadframe 20 is not inclined at this time to be moved through the track 100 in the direction A.

The leadframe 20 is fixed to the track 100 when it is desirable to secure electrical components to the leadframe units, e.g., during bonding operations in which dies and/or wires are fixed to one or more of the leadframe units. It will be appreciated that the clamping magnets 126, 128 can also be used to fix the gripping device 40 to the first end 104 of the track 100 when the leadframe 20 is to be received by the gripping device from the supply magazine. That said, the bonding operations can be performed from the top and/or bottom of the stationary leadframe 20. To this end, the base 110 of the track 100 can include one or more openings (not shown) to allow components of the bonding operation, e.g., a heat block or soldering device, to access the bottom of the leadframe 20.

Once the bonding operations are performed on leadframe units of the leadframe 20, the current is reversed to the clamping magnets 126, 128 such that the gripping members 50a, 50b, 80a, 80b are magnetically repelled RE by the track 100. Current is also reapplied to the guide magnets 140, 142 in the manner described to again move the gripping members 50a, 50b, 80a, 80b and leadframe 20 through the track 100 in the direction A to the end of the track and into the retrieving magazine (not show).

The bonding operations can be performed on all the leadframe units of the leadframe 20 by fixing the leadframe in place one time. If needed, however, the process of fixing and levitating the leadframe 20 can be repeated while propelling the leadframe down the track 100 in order to sequentially perform bonding operations on different leadframe units. For example, each leadframe unit could be incrementally fixed to the track 100 at indexing position (4) to enable individual bonding operations to be performed on that particular leadframe unit.

In an alternative example configuration, the guide magnets 140, 142 on the arms 112, 114 can be permanent magnets instead of electromagnets. In this configuration, the structure of the conveyor 16 may be otherwise unchanged. The polarity of the permanent magnets 140, 142 alternates in the same manner at each indexing position (1)-(10) along each arm 112, 114. Current can be selectively applied to the clamping magnets 126, 128 in a manner that magnetically repels RE the gripping members 50a, 50b, 80a, 80b, causing the gripping members and leadframe 20 to levitate over the track 100. Current can also selectively applied to the clamping magnets 126, 128 in a manner that magnetically attracts AT the gripping members 50a, 50b, 80a, 80b to the track 100, causing the leadframe 20 to be securely fixed to the track in the manner described.

The guide magnets 66, 96 in this configuration are permanent magnets and therefore always act to induce movement in the gripping members 50a, 50b, 80a, 80b and leadframe 20 through the track 100 in the direction A. Consequently, when current is reversed to the clamping magnets 126, 128 to magnetically repel RE the gripping members 50a, 50b, 80a, 80b the gripping members and leadframe 20 automatically move through the track 100 in the direction A.

Figure 7A:
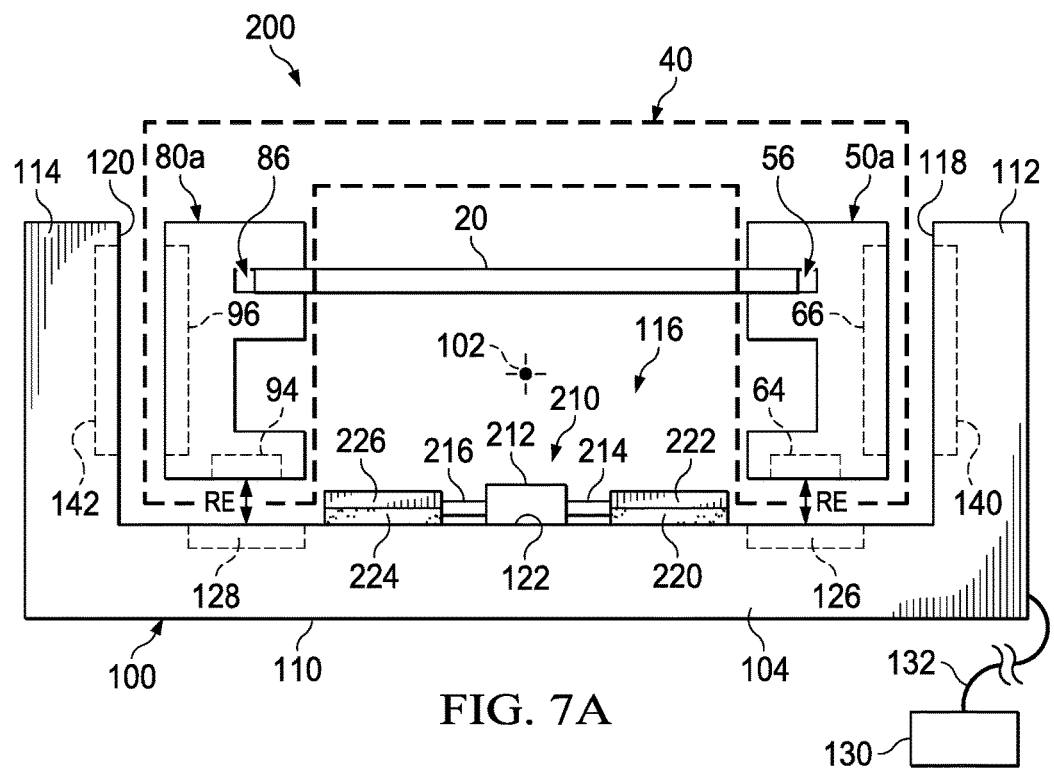
FIG. 7A is a front view of another example conveyor apparatus in a first condition.
Figure 7B:
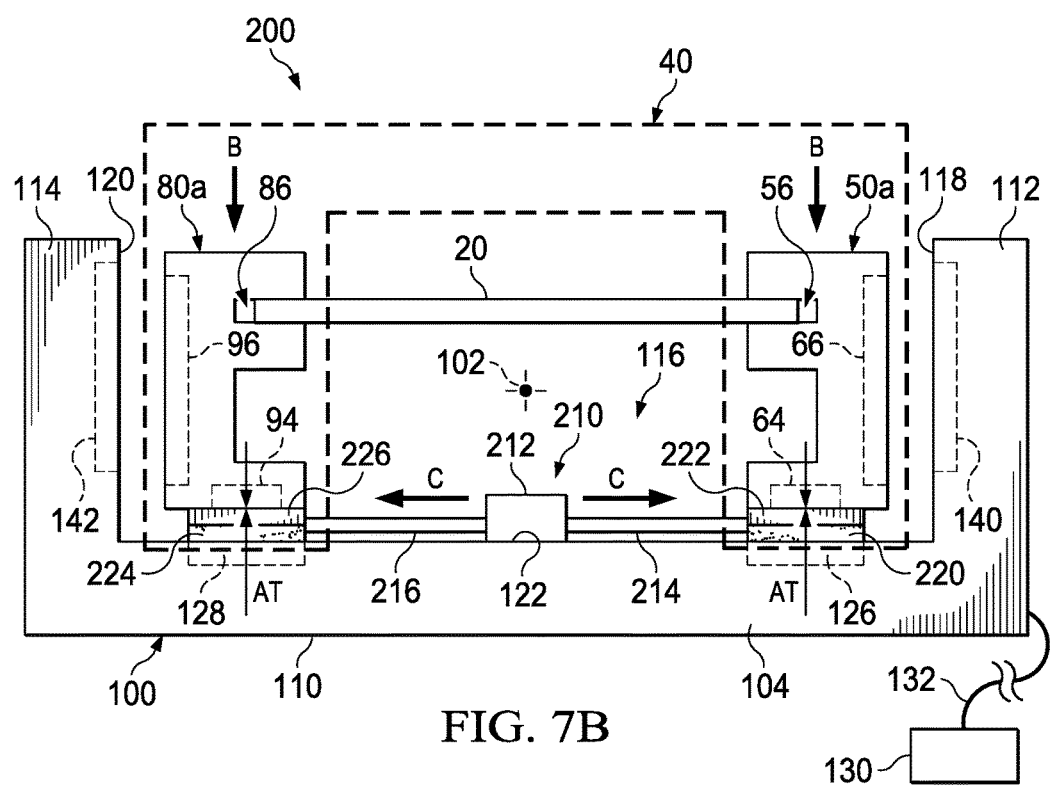
FIG. 7B is a front view of the apparatus of FIG. 7A in a second condition.

FIGS. 7A-7B illustrates another example conveyor apparatus 200. Features in the conveyor 200 that are similar to features in the conveyor 16 are given the same reference numbers. In the conveyor 200, the guide magnets 66, 96 on the gripping members 50a, 50b, 80a, 80b are permanent magnets. The guide magnets 140, 142 on the arms 112, 114 are also permanent magnets. Therefore, the guide magnets 140, 142 always induce movement of the gripping members 50a, 50b, 80a, 80b and leadframe 20 through the track 100 in the direction A.

The clamping magnets 64, 94 on the gripping members 50a, 50b, 80a, 80b are permanent magnets. The clamping magnets 126, 128 on the base 110 are also permanent magnets. The polarity of the clamping magnets 126, 128 is selected to magnetically repel RE the gripping members 50a, 50b, 80a, 80b at all times. Consequently, the conveyor 200 includes structure 210 for selectively blocking the magnetic interaction between the clamping magnets 64, 126 and 94, 128, respectively.

To this end, the blocking structure 210 includes a linear actuator 212 secured to the base 110 of the track 100 within the passage 116. Actuating arms 214, 216 extend in opposite directions from the actuator 212 towards the arms 112, 114. A magnetic shield 220 and metal bar 222 are secured to the actuating arm 214 in an overlying manner. The magnetic shield 220 is positioned between the base 110 and the metal bar 222. The metal bar 222 and magnetic shield 220 are both longer than the distance between the clamping magnets 64 on the gripping members 50a, 50b.

A magnetic shield 224 and metal bar 226 are secured to the actuating arm 216 in an overlying manner. The magnetic shield 224 is positioned between the base 110 and the metal bar 226. The metal bar 226 and magnetic shield 224 are both longer than the distance between the clamping magnets 94 on the gripping members 80a, 80b. For example, the magnetic shields 220, 224 are formed from a non-magnetic material. As a further example, the metal bars 222, 226 are ferromagnetic, e.g., Ni, Co, Fe, steel, etc.

Referring to FIG. 7A, the actuator 212 has a first condition in which the actuating arms 214, 216 are retracted such that the magnetic shield 220 and ferromagnetic bar 222 are misaligned with the clamping magnets 64, 126 associated with the first gripping members 50a, 50b. Furthermore, the magnetic shield 224 and ferromagnetic bar 226 are misaligned with the clamping magnets 94, 128 associated with the second gripping members 80a, 80b. In this first condition, the clamping magnets 64, 126 magnetically repel RE one another and the clamping magnets 94, 128 magnetically repel RE one another. Consequently, the gripping members 50a, 50b, 80a, 80b and leadframe 20 are moved through the track 100 in the direction A.

The actuator 212 can be actuated to a second condition when it is desirable to fix the gripping members 50a, 50b, 80a, 80b in place to load the leadframe 20 into the gripping device 40 or perform bonding operations on the leadframe. Referring to FIG. 7B, actuating the actuator 212 extends the actuating arms 214, 216 outward from one another in the direction indicated by the arrows C towards the arms 112, 114. When this occurs, the magnetic shield 220 and ferromagnetic bar 222 become aligned with the clamping magnets 64, 126 associated with the first gripping members 50a, 50b. Furthermore, the magnetic shield 224 and ferromagnetic bar 226 become aligned with the clamping magnets 94, 128 associated with the second gripping members 80a, 80b.

Transitioning the actuator 212 to the second condition can produce two concurrent results. First, the magnetic shields 220, 224 overlay the clamping magnets 126, 128 in the base 110, thereby blocking magnetic interaction between the clamping magnets 64, 126 and the clamping magnets 94, 128. Second, the ferromagnetic bars 222, 226 magnetically attract AT the clamping magnets 64, 94 on the respective gripping members 50a, 50b, 80a, 80b. Consequently, the gripping members 50a, 50b, 80a, 80b move downward in the direction B into engagement with the ferromagnetic bars 222, 226, thereby securely fixing the gripping members to the ferromagnetic bars. This fixation enables the leadframe 20 to be loaded into the gripping device 40 and, later, further enables bonding operations to be performed accurately on the leadframe.

When it is desirable to move the leadframe 20 through the track 100, the actuator 212 is actuated to the first condition. In other words, the actuating arms 214, 216 are retracted to move the magnetic shields 220, 224 and ferromagnetic bars 222, 226 out of alignment with the clamping magnets 64, 126 and 94, 128, respectively. Absent alignment with the magnetic shields 220, 224 and ferromagnetic bars 222, 226, the clamping magnets 126, 128 again magnetically repel RE the clamping magnets 64, 94 and return the gripping members 50a, 50b, 80a, 80b to the position shown in the example of FIG. 7A, which levitates the gripping members over the track 100. The guide magnets 66, 96, 140, 142 then automatically move the gripping members 50*a*, 50*b*, 80*a*, 80*b* and leadframe 20 through the track 100 in the direction A.

It is clear from the above that the magnetic clamping system in FIGS. 7A-7B includes not only the permanent clamping magnets 126, 128 in the base 110 but also the ferromagnetic bars 222, 226 and magnetic shields 220, 224. These components cooperate to either magnetically attract AT or magnetically repel RE the gripping device 40 and leadframe 20.

The actuator 212 can be actuated once to the second condition for each leadframe 20 if all the leadframe units are bonded at that time. Alternatively, the actuator 212 can be actuated between the first and second conditions as needed to incrementally bond the leadframe units in the manner previously described. Furthermore, it will be appreciated that when the gripping device 40 includes a single clamping magnet the actuator 212 will be connected to a single ferromagnetic bar and a single magnetic shield (not shown) for selectively levitating the gripping device over the track or fixing the gripping device to the track.

Figure 8:
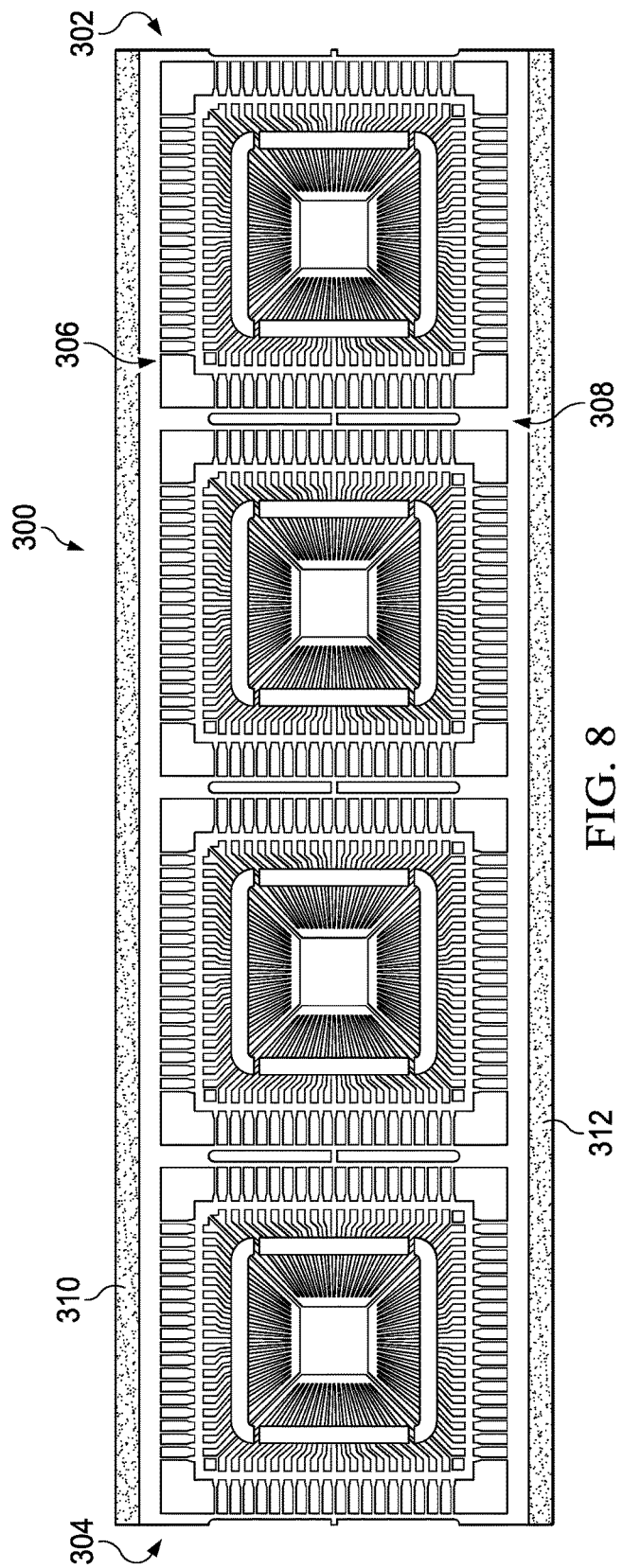
FIGS. 8-9 are schematic illustrations of a leadframe and alternative conveyor apparatus.

FIGS. 8-10B illustrate another example conveyor apparatus 250 for moving a leadframe 300 in the direction A through a track 260. Referring to FIG. 8, the leadframe 300 extends longitudinally from a first end 302 to a second end 304. The leadframe 300 has a first lateral side 306 and an opposing, second lateral side 308. The sides 306, 308 of the leadframe are coated with ferromagnetic material. As with the leadframe 20, the leadframe 300 is formed from a plurality of individual leadframe units integrally formed together in an end-to-end manner.

Figure 9:
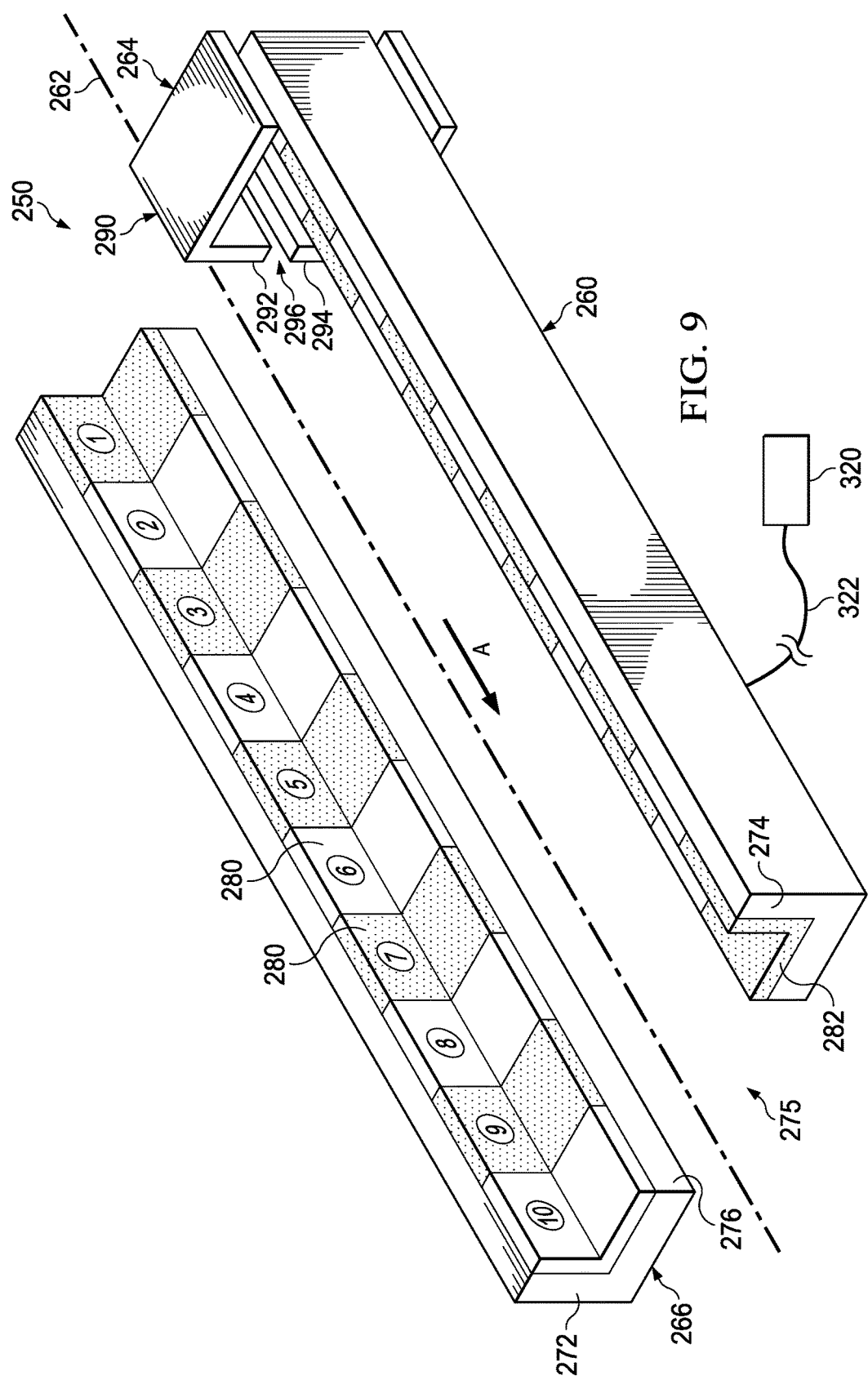

As shown in the example of FIG. 9, the track 260 has a longitudinal centerline 262 and extends from a first end 264 to a second end 266. The track 260 includes first and second arms 272, 274 on opposite sides of the centerline 262 that cooperate to form a central passage 275. The arms 272, 274 include interior sides 276 and 278, respectively, facing the centerline 262 and one another. As shown, the arms 272, 274 are not connected to one another, but could alternatively be interconnected by a base (not shown) extending therebetween to form a U-shaped track.

A series of magnets 280 is provided on the interior side 276 of the first arm 272 facing the centerline 262. The magnets 280 are electromagnets or solenoids that generate magnetic fields in response to an electric current provided by a source 320. Consequently, the strength and polarity of the magnets 280 is adjustable, depending on the current applied thereto by the source 320. As shown, each magnet 280 has a position index indicated at (1), (2), (3), etc. along the length of the track 260.

A series of magnets 282 is provided on the interior side 278 of the second arm 274 facing the centerline 262. The magnets 282 are electromagnets or solenoids that generate magnetic fields in response to an electric current provided by a source 320. Consequently, the strength and polarity of the magnets 282 is adjustable, depending on the current applied thereto by the source. The magnets 280, 282 can be exposed through the interior side 276, 282 of the respective arm 272, 274 or completely covered by the arm (not shown).

In another example, the magnets 280, 282 can be permanent magnets arranged along the length of the track 260 such that the magnetic field is nullified in order to selectively levitate the leadframe 300 over the track, e.g., the magnets can be arranged in a Halbach array (not shown). In any case, the magnetic fields of the magnets 280, 282 extend inwards beyond the respective interior side 276, 278 and into the interior passage 275.

A gripping device 290 is associated with the track 260 to help move the leadframe 300 along the track. The gripping device 290 includes a pair of gripping arms 292, 294 spaced apart to provide a gap 296 sized to receive the second side 308 of the leadframe 300. The gripping arms 292, 294 are actuatable towards and away from one another in a known manner, e.g., hydraulic, pneumatic or magnetic, to selectively grasp the leadframe 300. The gripping arms 292, 294 also move together in the longitudinal direction A relative to the track 260

The magnets 280, 282 on the track 260 cooperate with the ferromagnetic coatings 310, 312 on the leadframe 300 to move the leadframe in the direction A relative to the track with the assist of the arms 292, 294. The leadframe 300 exits the supply magazine (not shown) and passes into the passage 275 in the track 260. More specifically, the first side 306 of the leadframe 300 extends along the interior side 276 and the second side 308 extends within the gap 296 between the gripping arms 292, 294. This places the ferromagnetic coating 310 in a position overlying the magnets 280 and places the ferromagnetic coating 312 in a position overlying the magnets 282.

Figure 10A:
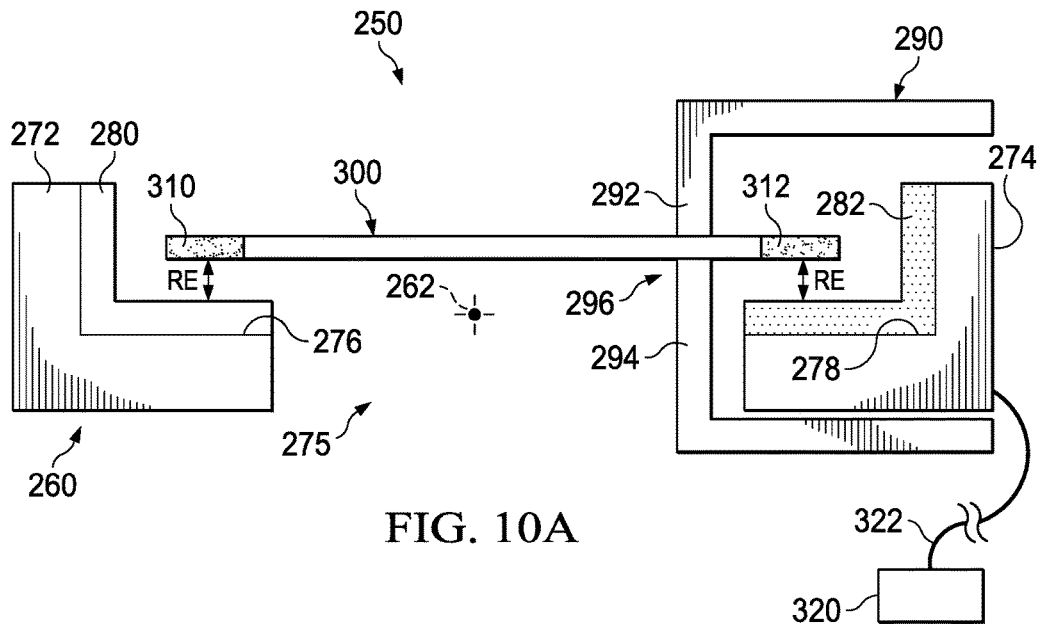
FIG. 10A is a front view of the apparatus of FIG. 8 in a first condition.

Referring to FIG. 10A, when it is desirable to move the leadframe 300 through the track 260 current is applied to the magnets 280, 282 in a manner that magnetically repels RE the ferromagnetic coatings 310, 312 on the leadframe 300 in a direction away from the base 270. This causes the leadframe 300 to levitate over the magnets 280, 282. The gripping arms 292, 294 are actuated towards one another to clamp the levitated leadframe 300. The gripping arms 292, 294 are the moved in the direction A to propel the leadframe 300 through the track 260 (see FIG. 9). Since the gripping arms 292, 294 directly engage the leadframe 300, the gripping arms should be made from a non-magnetic material to prevent magnetic noise between the ferromagnetic coatings 310, 312 and the magnets 280, 282.

Figure 10B:
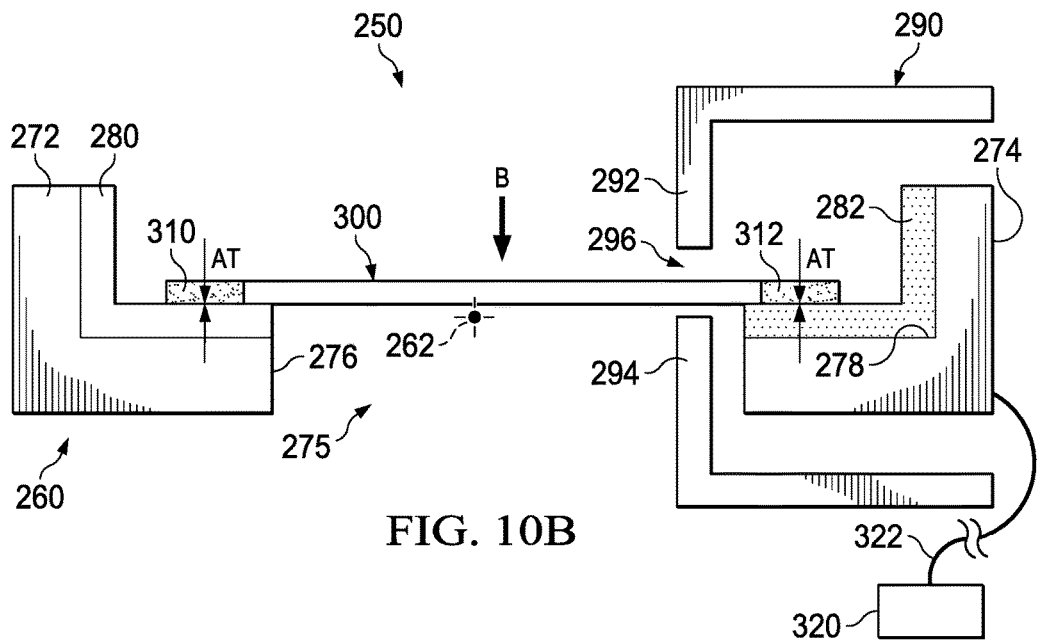
FIG. 10B is a front view of the apparatus of FIG. 8 in a second condition.

Referring to FIG. 10B, when it is desirable to fix the position of the leadframe 300 along the track 260, the gripping arms 292, 294 cease movement in the direction A. The gripping arms 292, 294 are then actuated away from one another to release the leadframe 300. Current is applied to the magnets 280, 282 in a manner that magnetically attracts AT the ferromagnetic coatings 310, 312 to the magnets 280, 282. Consequently, the leadframe 300 moves downward in the direction B into engagement with the magnets 280, 282, thereby securely fixing the leadframe to the magnets. This allows any bonding operations to be performed on the stationary leadframe 300. While this occurs, current can also be applied to the magnets 280, 282 in a manner that does not induce movement of the leadframe 300.

Once any bonding operations are performed on the leadframe 300, current is applied to the magnets 280, 282 in a manner that magnetically repels RE the ferromagnetic coatings 310, 312 to thereby levitate the leadframe 300 over the magnets 280, 282. The gripping arms 292, 294 are actuated to grip the leadframe 300 in the manner previously described to again move the leadframe through the track 260 in the direction A to the retrieving magazine (not shown).

Similar to the conveyor 16, bonding operations can be performed on all the leadframe units of the leadframe 300 in the conveyor 250 by fixing the leadframe in place one time. If needed, however, the process of fixing and levitating the leadframe 300 can be repeated while propelling the leadframe down the track 260 in order to sequentially perform bonding operations on different leadframe units, as previously described.

It is clear from the above that the magnets 280, 282 on the track 260 act to ensure the leadframe 300 is not misaligned between the arms 272, 274 and between the arms 292, 294. The gripping arms 292, 294 then control movement of the leadframe 300 through and within the passage 275 of the track 260. Once the leadframe 300 exits the conveyor 250 the ferromagnetic coatings 310, 312 can be removed from the leadframe 300 as they are no longer needed.

Compared to many existing leadframe conveyor structures, the conveyors disclosed herein mitigate wear on and damage to the leadframe and electrical components secured thereto. More specifically, the gripping device maintains constant contact with both sides of the leadframe along the entire length of the track and, thus, no cantilevering of the leadframe can occur. Consequently, the leadframe maintains its planar shape, which further is parallel to the surface of the track, while it is moved/processed through the entire conveyor. Furthermore, the magnetic—as opposed to mechanical—conveyance of the leadframe through the track ensures that the leadframe does not engage any portion of the track. In other words, the leadframe moves in a frictionless manner through the track and does not abrade on the gripping device or track.

Moreover, the constant, dual-sided connection between the gripping device and the leadframe, coupled with the frictionless transport, prevents the leadframe from vibrating during transport, which alleviates damage to any lead wires connected to the leadframe prior to or during transport through the conveyor. Weakened stitch bonds and damaged ball necks, e.g., broken, stressed, depressed or sagged, at the connection between the lead wires and die pad/leadframe can therefore be avoided.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A conveyor apparatus for a leadframe comprising:
   a track defining a longitudinally extending passage through which the leadframe travels, a magnetic clamping system and a plurality of first guide magnets being provided on the track; and
   a gripping device to secure to the leadframe, at least one clamping magnet and a plurality of second guide magnets being secured to the gripping device;
   the first and second guide magnets cooperating to move the gripping device in a first direction along the length of the passage while in a first condition that is spaced from the track,
   the magnetic clamping system and the at least one clamping magnet cooperating to selectively move the gripping device in a second direction that is substantially perpendicular to the first direction between the first condition spaced from the track to a second condition magnetically fixed to the track.

2. The apparatus of claim 1, wherein the track includes a base and first and second arms extending from the base, the magnetic clamping system being provided on the base and a plurality of the first guide magnets being secured to each first and second arm, the gripping device including a plurality of gripping members each configured to be secured to the leadframe, each gripping member including a clamping magnet and a second guide magnet.

3. The apparatus of claim 2, wherein the first guide magnets on the first arm have a polarity opposite to a polarity of the first guide magnets on the second arm at the corresponding longitudinal positions along the track.

4. The apparatus of claim 1, wherein the gripping device includes
   a pair of first gripping members each having a pair of arms separated by a space for receiving a first side of the leadframe, each first gripping member including one of the second guide magnets; and
   a pair of second gripping members each having a pair of arms separated by a space for receiving a second, opposite side of the leadframe, each second gripping member including one of the second guide magnets.

5. The apparatus of claim 4, wherein the magnetic clamping system includes a permanent magnet secured to the track, a ferromagnetic bar, and a magnetic shield secured to the ferromagnetic bar, an actuator connected to the ferromagnetic bar and the magnetic shield having a first corresponding condition in which the ferromagnetic bar and the magnetic shield are misaligned from the permanent magnet and the at least one clamping magnet to allow for movement of the leadframe in the first direction, the actuator having a second corresponding condition in which the magnetic shield overlies the permanent magnet to prevent magnetic interaction therebetween and the ferromagnetic bar is aligned with the at least one clamping magnet and magnetically attracts the at least one clamping magnet.

6. The apparatus of claim 5, wherein movement of the actuator to the second condition causes the gripping device to move in a second direction perpendicular to the first direction into engagement with the ferromagnetic bar to fix the gripping device to the track.

7. The apparatus of claim 1, wherein the first guide magnets are electromagnets and the second guide magnets are permanent magnets, the magnetic clamping system including an electromagnet and the at least one clamping magnet being a permanent magnet.

8. The apparatus of claim 1, wherein the first guide magnets and the second guide magnets are permanent magnets, the magnetic clamping system including an electromagnet and the at least one clamping magnet being a permanent magnet.

9. The apparatus of claim 1, wherein the leadframe is spaced entirely from the track while the gripping device moves in the first direction along the entire length of the track.

10. The apparatus of claim 1, wherein the gripping device maintains the leadframe in a planar shape during movement along the entire length of the track in the first direction.

11. The apparatus of claim 1, wherein the first guide magnets alternate polarity along the length of the track in the first direction.

12. The apparatus of claim 1, wherein the gripping device is configured to engage opposite sides of the leadframe to prevent relative movement between the sides during movement of the gripping device through the track.

13. A method for conveying a leadframe comprising:
provide a track defining a passage through which the leadframe travels, a magnetic clamping system and a plurality of first guide magnets being provided on the track; and
securing a gripping device having at least one clamping magnet and a plurality of second guide magnets to the leadframe;
magnetically moving the gripping device and the leadframe in a first direction through the passage using the first and second guide magnets;
inducing a first magnetic interaction between the magnetic clamping system and the at least one clamping magnet to space the gripping device from the track and allow the gripping device to move the leadframe in the first direction; and
inducing a second, different magnetic interaction between the magnetic clamping system and the at least one clamping magnet to move the gripping device in a second direction perpendicular to the first direction to magnetically fix the gripping device to the track.

14. The method of claim 13, wherein the at least one clamping magnet is an electromagnet, the step of inducing the first magnetic interaction including applying a first current to the at least one clamping magnet, and the step of inducing the second magnetic interaction including applying a second, reverse current to the at least one clamping magnet.

15. The method of claim 13, wherein the magnetic clamping system comprises at least one electromagnet secured to the track, current applied to the at least one electromagnet being varied to induce the first and second magnetic interactions.

16. The method of claim 13, wherein the magnetic clamping system comprises a permanent magnet secured to the track and a ferromagnetic bar connected to a magnetic shield, the step of inducing the first magnetic interaction including moving the ferromagnetic bar and the magnetic shield out of alignment with the at least one clamping magnet and the permanent magnet, the step of inducing the second magnetic interaction including moving the ferromagnetic bar and the magnetic shield into alignment with the permanent magnet and the at least one clamping magnet.

17. The method of claim 16 further comprising actuating an actuator connected to the ferromagnetic bar and the magnetic shield between a first condition misaligning the ferromagnetic bar and the magnetic shield with the at least one clamping magnet and the permanent magnet and a second condition aligning the ferromagnetic bar and the magnetic shield with the at least one clamping magnet and the permanent magnet.

18. A conveyor apparatus comprising:
a leadframe having a longitudinal centerline and first and second sides extending parallel to the centerline, each first and second side having a ferromagnetic coating;
a track defining a longitudinal passage through which the leadframe travels in a first direction, a plurality of electromagnets being secured to the track adjacent the coating on each side of the leadframe, the electromagnets having a first condition spaced from the coatings on the leadframe and magnetically cooperating with the coatings to levitate the leadframe above the track, the electromagnets having a second condition magnetically cooperating with the coatings such that the coatings engage the electromagnets to fix the leadframe to the track; and
a gripping device associated with the track for grasping the leadframe when the electromagnets are in the first condition to move the leadframe in the first direction.

19. The apparatus of claim 18, wherein a first current is applied to the electromagnets in the first condition to repel the coatings and levitate the leadframe over the electromagnets, a second, reverse current being applied to the electromagnets in the second condition to attract the coatings and fix the leadframe to the electromagnets.

20. The apparatus of claim 18, wherein the gripping device further comprises gripping arms separated by a space to receive therein the first side of the leadframe, the gripping arms being actuatable being a first condition grasping the first side and a second condition spaced from the first side.

* * * * *